United States Patent
Jin

(10) Patent No.: US 7,186,627 B2
(45) Date of Patent: Mar. 6, 2007

(54) METHOD FOR FORMING DEVICE ISOLATION FILM OF SEMICONDUCTOR DEVICE

(75) Inventor: Seung Woo Jin, Gyeonggi-do (KR)

(73) Assignee: Hynix Semiconductor Inc, Gyeonggi-do (KR)

( * ) Notice: Subject to any disclaimer, the term of this patent is extended or adjusted under 35 U.S.C. 154(b) by 5 days.

(21) Appl. No.: 10/998,963

(22) Filed: Nov. 30, 2004

(65) Prior Publication Data

US 2005/0282349 A1    Dec. 22, 2005

(30) Foreign Application Priority Data

Jun. 16, 2004   (KR) ...................... 10-2004-0044521

(51) Int. Cl.
*H01L 21/76* (2006.01)

(52) U.S. Cl. ................ 438/429; 438/503; 257/E21.562

(58) Field of Classification Search ................ 438/429, 438/481, 503; 257/E21.562
See application file for complete search history.

(56) References Cited

U.S. PATENT DOCUMENTS

| 6,103,594 A * | 8/2000 | See et al. ................... 438/427 |
| 6,887,788 B2 * | 5/2005 | Cho et al. ................... 438/672 |
| 2003/0199149 A1 * | 10/2003 | Lee et al. ................... 438/424 |

* cited by examiner

*Primary Examiner*—Matthew Smith
*Assistant Examiner*—Julio J. Maldonado
(74) *Attorney, Agent, or Firm*—Heller Ehrman LLP

(57) ABSTRACT

A method for forming device isolation film of semiconductor device is provided, the method including forming a pad oxide film, a pad nitride film, and an oxide film for device isolation on a semiconductor substrate, etching a predetermined region of the oxide film for device isolation, the pad nitride film, the pad oxide film, and the semiconductor substrate to form a trench, forming a SEG silicon layer in the trench to form an active region, and forming a gap-fill insulating film on the resulting structure having a gap between sidewalls of the trench and the SEG silicon layer.

15 Claims, 6 Drawing Sheets

METHOD FOR FORMING DEVICE ISOLATION FILM OF SEMICONDUCTOR DEVICE

BACKGROUND OF THE INVENTION

1. Field of the Invention

The present invention generally relates to a method for forming a device isolation film of a semiconductor device, and more specifically to a method for forming a device isolation film of a semiconductor device wherein a predetermined region of a semiconductor substrate is etched to form a trench and a Selective Epitaxial Growth ("SEG") silicon layer is formed in the trench to enhance the characteristic of semiconductor device.

2. Description of the Related Art

FIGS. 1a through 1g are cross-sectional views illustrating a conventional method for forming device isolation film of semiconductor device.

Referring to FIG. 1a, a pad oxide film 110 and a pad nitride film 120 are sequentially deposited on a semiconductor substrate 100.

Referring to FIG. 1b, a predetermined region of the pad nitride film 120, the pad oxide film 110, and the semiconductor substrate 100 is etched to form a trench 130.

Referring to FIG. 1c, a sidewall oxide film 140 is formed on a surface of the trench 130.

Referring to FIG. 1d, a liner oxide film 150 and a liner nitride film 160 are sequentially deposited on the entire surface of the semiconductor substrate including the trench 130.

Referring to FIG. 1e, a HDP oxide film 170 is deposited to fill up the trench 130.

Referring to FIG. 1f, a planarized process is performed via a CMP process to expose the pad nitride film 120.

Referring to FIG. 1g, the pad nitride film 120 is removed to form a device isolation film 170.

As described above, in accordance with the conventional method for forming device isolation film of semiconductor device, a predetermined region of a semiconductor substrate is etched to form a trench and the trench is filled up with a HDP oxide film to form a device isolation. However, while the depth of the trench is maintained, the width of the trench is reduced as the size of the semiconductor device is decreased, i.e. the aspect ratio of the device isolation film is increased. As a result, a void is generated in formation of the gap-fill insulating film, thereby degrading the barrier characteristic of the device.

SUMMARY OF THE INVENTION

Accordingly, it is an object of the present invention to provide a method for forming device isolation film of semiconductor device wherein a trench formed by etching a predetermined region of a semiconductor substrate is filled up with a SEG silicon layer to prevent the generation of voids during the gap-fill process and moats at the upper edge of the device isolation film.

It is another object of the present invention to provide a method for forming device isolation film of semiconductor device wherein the damage of a liner nitride film adjacent to the moats is minimized to inhibit generation of hot electrons, thereby improving the punch-through and current characteristics of a semiconductor device. As a result, the process is simplified, and the refresh characteristic of a semiconductor device is improved.

In order to achieve above-described object, there is provided a method for forming device isolation film of semiconductor device, the method comprising the steps of:

(a) forming a pad oxide film, a pad nitride film, and an oxide film for device isolation on a semiconductor substrate;

(b) etching a predetermined region of the oxide film for device isolation, the pad nitride film, the pad oxide film, and the semiconductor substrate to form a trench;

(c) forming a SEG silicon layer in the trench to form the active region; and (d) forming a gap-fill insulating film on the resulting structure having a gap between sidewalls of the trench and the SEG silicon layer.

DETAILED DESCRIPTION OF THE EXAMPLARY EMBODIMENTS

Figure 1A:
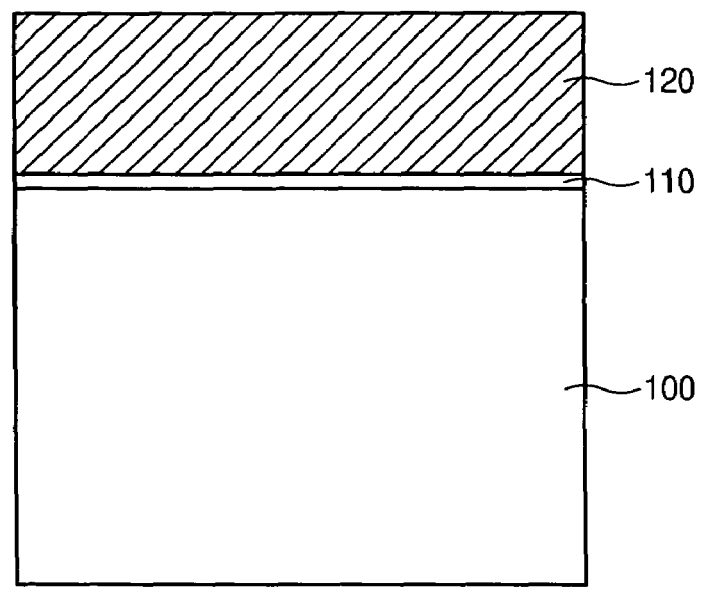
FIGS. 1a through 1g are cross-sectional views illustrating a conventional method for forming device isolation film of semiconductor device.
Figure 1B:
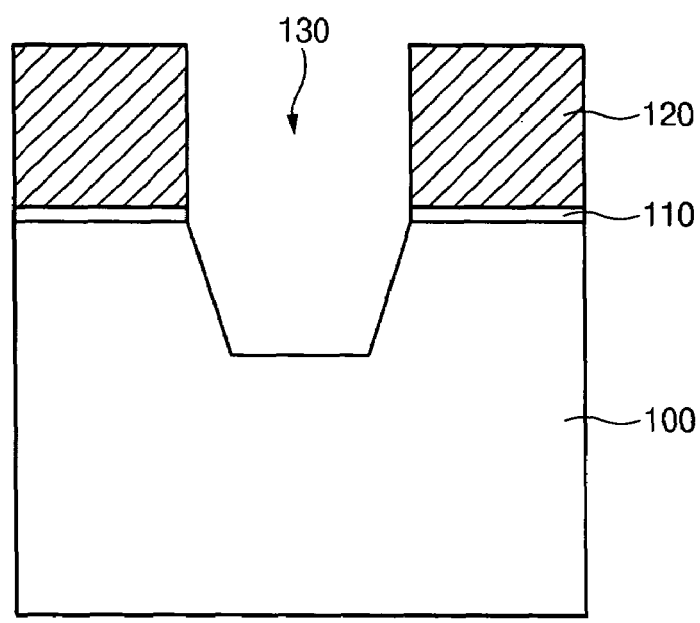
Figure 1C:
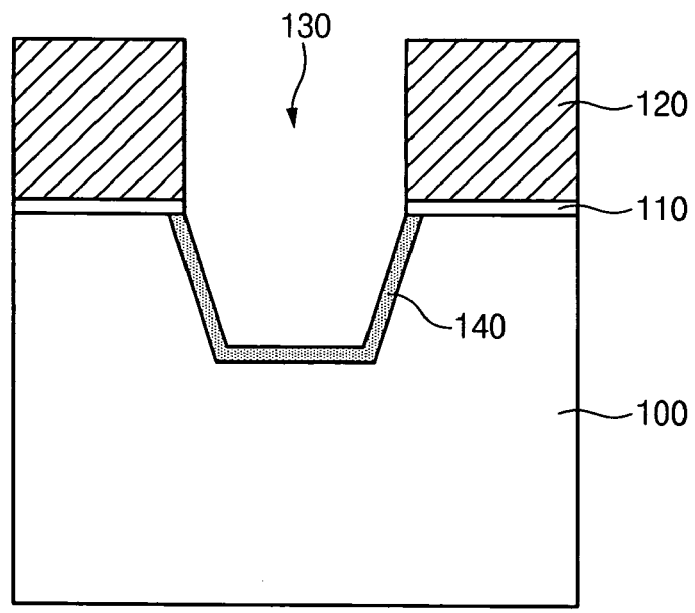
Figure 1D:
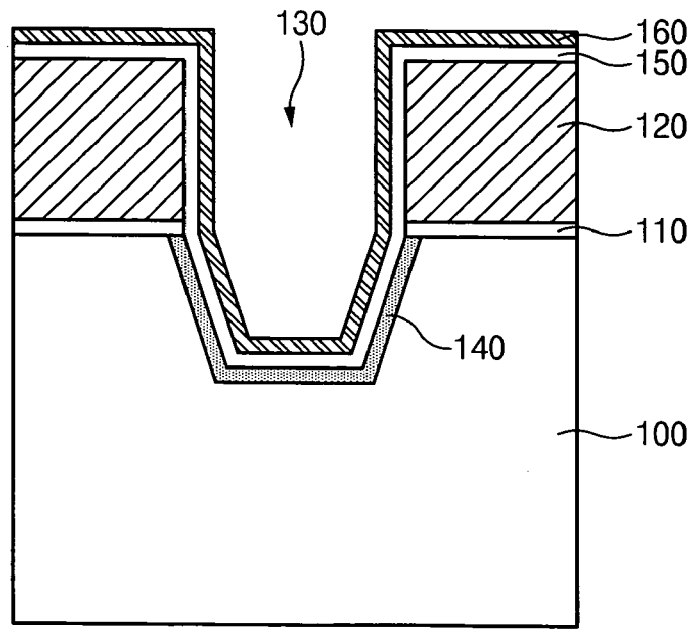
Figure 1E:
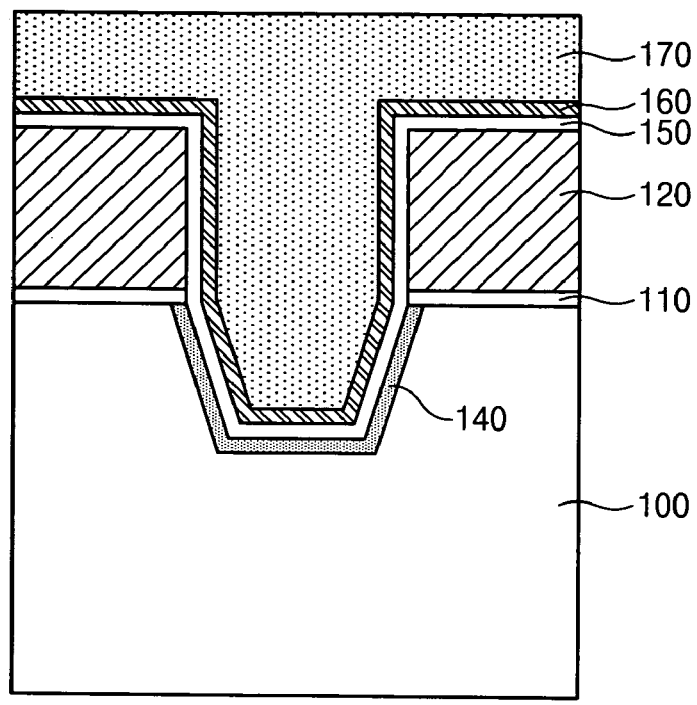
Figure 1F:
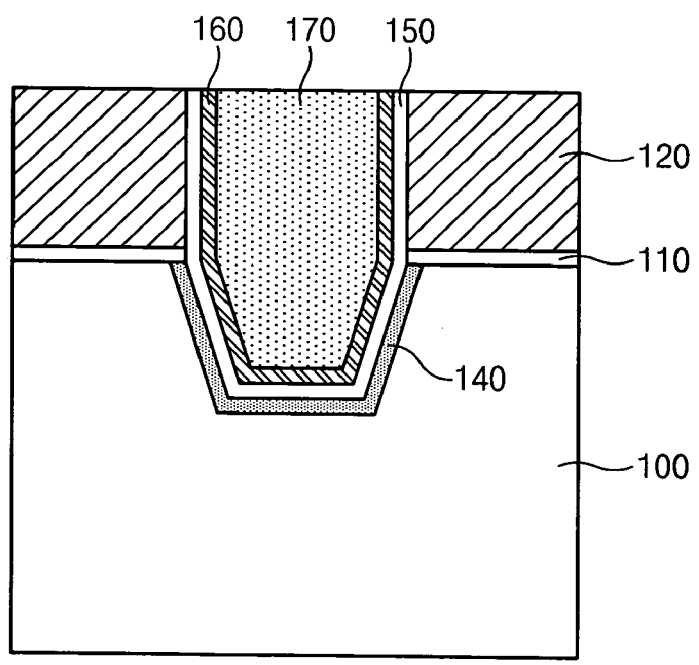
Figure 1G:
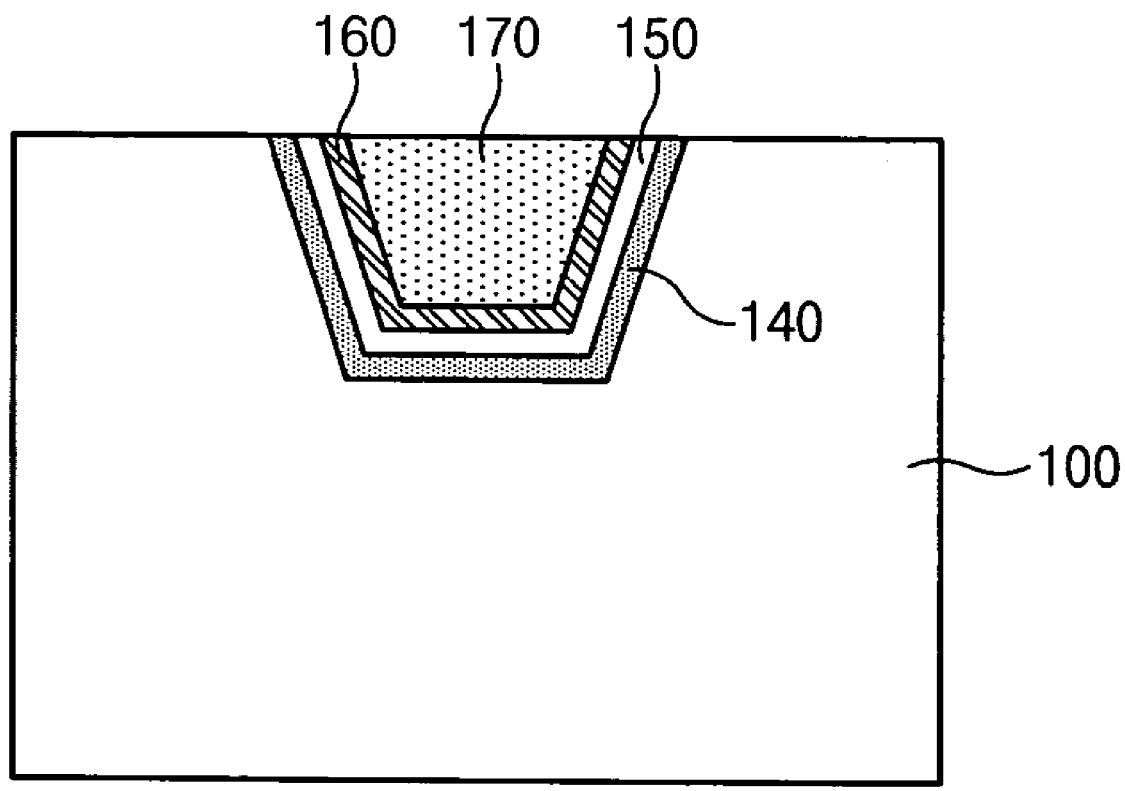

A method for forming device isolation film of semiconductor device in accordance with an embodiment of the present invention will now be described in detail with reference to the accompanying drawings. Wherever possible, the same reference numerals will be used throughout the drawings to refer to the same or like parts.

Figure 2A:
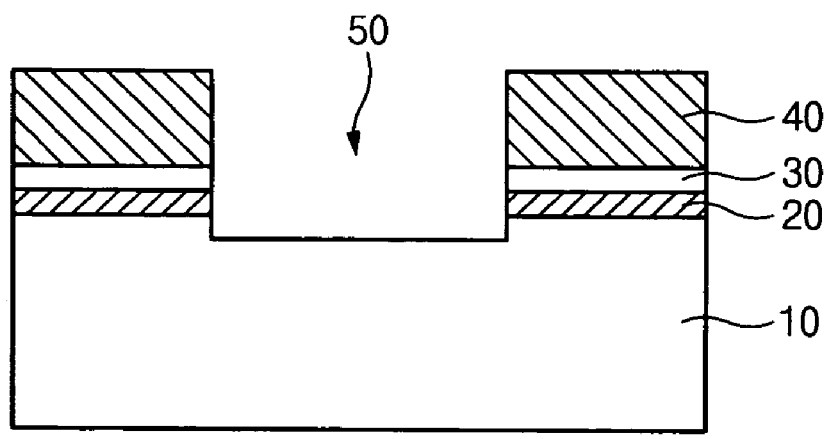
FIGS. 2a through 2c are cross-sectional views illustrating a method for forming device isolation film of semiconductor device according to the present invention.
Figure 2B:
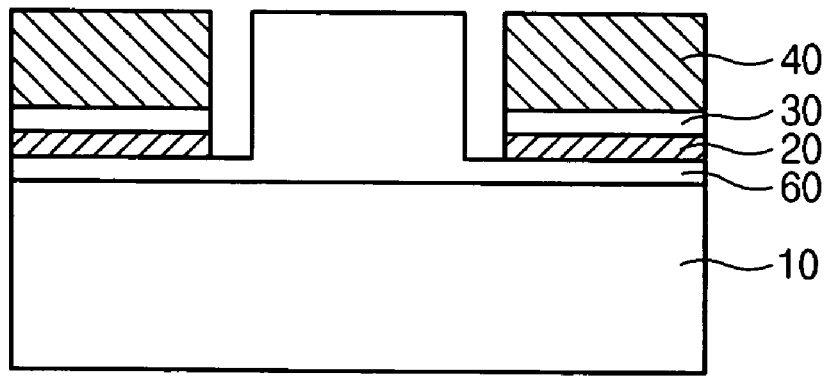
Figure 2C:
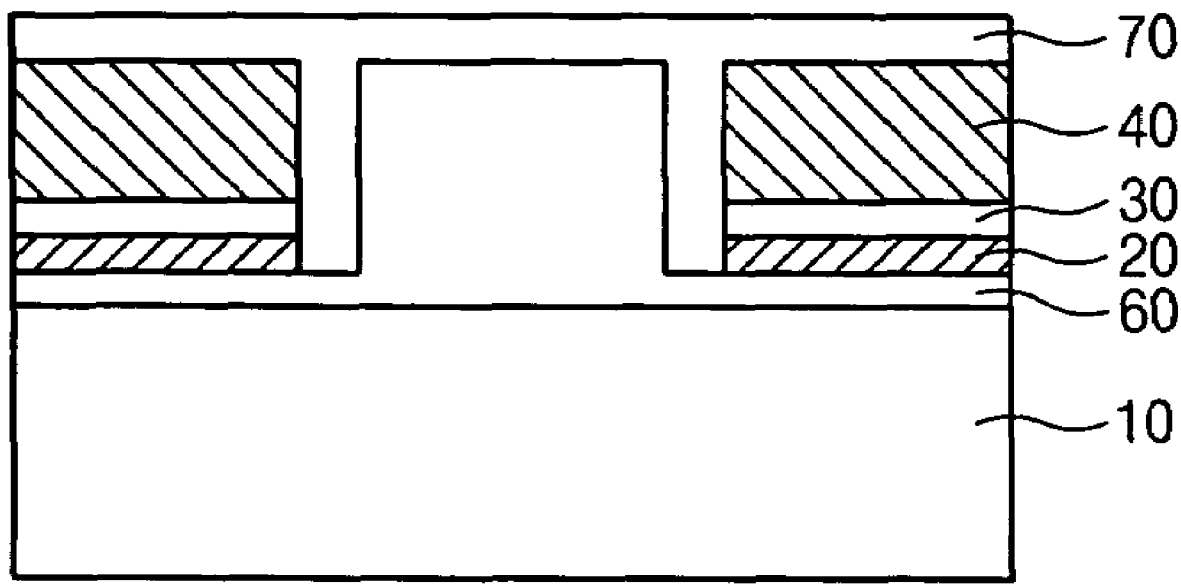

FIGS. 2a through 2c illustrate a method for forming device isolation film of semiconductor device according to the present invention.

Referring to FIG. 2a, a pad oxide film 20 and a pad nitride film 30, and an oxide film 40 for device isolation are formed on a semiconductor substrate 10. Next, a predetermined region of the oxide film 40 for device isolation, the pad nitride film 30, the pad oxide film 20 and the semiconductor substrate 10 where an active region is to be formed are etched to form a trench 50.

Preferably, the pad oxide film 20 has a thickness ranging from 270 Å to 330 Å, the pad nitride film 30 has a thickness ranging from 90 Å to 110 Å, and the oxide film 40 for device isolation has a thickness ranging from 3500 Å to 4500 Å. In addition, the depth of the semiconductor substrate 10 etched in the formation of the trench 50 preferably ranges from 90 Å to 110 Å.

Referring to FIG. 2b, a SEG silicon layer 60 is grown in the trench 50 to form an active region. The semiconductor substrate 10 may be cleaned using a mixture of $H_2$ and $N_2$ prior to the formation of the SEG silicon layer 60. The SEG silicon layer 60 is grown using the sidewalls of the trench 50 as a growing barrier and a gap is formed between the sidewall of the trench 50 and the SEG silicon layer 60.

Referring to FIG. 2c, a gap-filling insulating film 70 is deposited on the entire surface of a semiconductor substrate. The gap-filling insulating film 70 completely fills up the gap between the sidewall of the trench 50 and the SEG silicon layer 60.

In one embodiment, the gap-filling insulating layer 70 is formed by sequentially depositing a liner oxide film (not shown) and a liner nitride film (not shown). Specifically, the liner oxide film is formed via a rapid thermal annealing ("RTA") process using a gas selected from the group consisting of $O_2$ and a mixture of $H_2$ and $O_2$ at a temperature ranging from 800° C. to 1200° C. for 10 sec to 120 sec. The liner nitride film is formed via an RTA process using a gas selected from the group consisting of $NH_3$, NO, and $N_2O$ at a temperature ranging from 800° C. to 1200° C. for 10 sec to 600 sec.

The liner oxide film (not shown) and the liner nitride film (not shown) may be formed in an in-situ manner. Preferably, a temperature variation of the in-situ process ranges from 1° C./sec to 200° C./sec.

In another embodiment, the gap-filling insulating film 70 is formed by depositing a liner oxide film and nitriding the liner oxide film (not shown) to form an oxynitride film. Specifically, the liner oxide film is subjected to a RTA process or a furnace annealing process to nitride the liner oxide film. The RTA process is preferably performed using a gas selected from the group consisting of $NH_3$, NO, and $N_2O$ at a temperature ranging from 800° C. to 1200° C. for 10 sec to 600 sec. In addition, a temperature of the RTA process may be varied at a rate ranging from 1° C./sec to 200° C./sec.

Accordingly, the method for forming device isolation film of semiconductor device according to the present invention can prevent generation of voids during the formation process of the gap-fill insulating layer and reduce moats at the upper edge of the device isolation film to maintain the reliability of the device.

In addition, the method minimizes the damage to the liner nitride adjacent to the moats to inhibit generation of hot electrons, thereby improving the punch-through and current characteristics of the device. As a result, the process is simplified, and the refresh characteristic of a semiconductor device is enhanced.

As the present invention may be embodied in several forms without departing from the spirit or scope thereof, it should also be understood that the above-described embodiments are not limited by any of the details of the foregoing description. Rather the present invention should be construed broadly as defined in the appended claims. All changes and modifications that fall within the metes and bounds of the claims, or equivalences of such metes and bounds are intended to be embraced by the appended claims.

What is claimed is:

1. A method for forming device isolation film of semiconductor device, the method comprising the steps of:
   (a) forming a pad oxide film, a pad nitride film, and an oxide film for device isolation on a semiconductor substrate;
   (b) etching the oxide film for device isolation, the pad nitride film, the pad oxide film, and the semiconductor substrate where an active region is to be formed to form a trench for the active region;
   (c) forming the active region a SEG silicon layer in the trench; and
   (d) forming a gap-fill insulating film on the resulting structure having a gap between sidewalls of the trench and the SEG silicon layer.

2. The method according to claim 1, wherein the pad oxide film has a thickness ranging from 270 Å to 330 Å.

3. The method according to claim 1, wherein the pad nitride film has a thickness ranging from 90 Å to 110 Å.

4. The method according to claim 1, wherein the oxide film for device isolation has a thickness ranging from 3500 Å to 4500 Å.

5. The method according to claim 1, wherein a depth of the semiconductor substrate etched in the step (b) ranges from 90 Å to 110 Å.

6. The method according to claim 1, the method further comprising the step of cleaning the semiconductor substrate using a mixture of $H_2$ and $N_2$ prior to the step (c).

7. The method according to claim 1, wherein the step (d) comprises depositing a liner oxide film and nitriding the liner oxide film to form an oxynitride film as the gap-fill insulating film.

8. The method according to claim 7, wherein the liner oxide film is subjected to a RTA process or a furnace annealing process so as to nitride the liner oxide film.

9. The method according to claim 8, wherein the RTA process is performed using a gas selected from the group consisting of $NH_3$, NO, and $N_2O$ at a temperature ranging from 800° C. to 1200° C. for 10 sec to 600 sec.

10. The method according to claim 8, wherein a temperature of the RTA process is varied at a rate ranging from 1° C./sec to 200° C./sec.

11. The method according to claim 1, wherein the gap-fill insulating film comprises a structure of a liner oxide film and a liner nitride film.

12. The method according to claim 11, wherein the liner oxide film and the liner nitride film are subjected to a RTA process and an in-situ process.

13. The method according to claim 12, wherein a temperature of the in-situ process is varied at a rate ranging from 1° C./sec to 200° C./sec.

14. The method according to claim 12, wherein the RTA process is performed using a gas selected from the group consisting of $O_2$ and the mixture of $H_2$ and $O_2$ at a temperature ranging from 800° C. to 1200° C. for 10 sec to 120 sec.

15. The method according to claim 12, wherein the RTA process is performed using a gas selected from the group consisting of $NH_3$, NO, and $N_2O$ at a temperature ranging from 800° C. to 1200° C. for 10 sec to 600 sec.

* * * * *